United States Patent
Takahashi

(10) Patent No.: US 11,233,023 B2
(45) Date of Patent: Jan. 25, 2022

(54) SEMICONDUCTOR DEVICE AND METHOD OF MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hiroaki Takahashi, Oita Oita (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 27 days.

(21) Appl. No.: 16/815,324

(22) Filed: Mar. 11, 2020

(65) Prior Publication Data

US 2021/0091021 A1 Mar. 25, 2021

(30) Foreign Application Priority Data

Sep. 20, 2019 (JP) ............... JP2019-171102

(51) Int. Cl.
*H01L 23/52* (2006.01)
*H01L 23/00* (2006.01)

(52) U.S. Cl.
CPC .............. *H01L 24/05* (2013.01); *H01L 24/03* (2013.01); *H01L 24/45* (2013.01); *H01L 24/85* (2013.01); *H01L 2224/0381* (2013.01); *H01L 2224/03614* (2013.01); *H01L 2224/03848* (2013.01); *H01L 2224/04042* (2013.01); *H01L 2224/05124* (2013.01); *H01L 2224/05147* (2013.01); *H01L 2224/05163* (2013.01); *H01L 2224/05564* (2013.01); *H01L 2224/05687* (2013.01); *H01L 2224/4502* (2013.01); *H01L 2224/85011* (2013.01); *H01L 2924/01013* (2013.01);

(Continued)

(58) Field of Classification Search
CPC ......... H01L 24/03; H01L 24/05; H01L 24/45; H01L 24/85; H01L 2224/03614; H01L 2224/0381; H01L 2224/03848; H01L 2224/04042; H01L 2924/01013; H01L 2924/01029; H01L 2924/05432
USPC .......................................... 257/784; 438/617
See application file for complete search history.

(56) References Cited

U.S. PATENT DOCUMENTS

| | | | |
|---|---|---|---|
| 5,200,361 A | 4/1993 | Onishi | |
| 8,207,052 B2 * | 6/2012 | Hua | ........................ H01L 24/05 |
| | | | 438/585 |
| 10,153,216 B2 * | 12/2018 | Oura | ........................ H01L 22/14 |

FOREIGN PATENT DOCUMENTS

| | | |
|---|---|---|
| JP | 2697952 B2 | 1/1998 |
| JP | 2004-241458 A | 8/2004 |
| JP | 2005-150508 A | 6/2005 |

* cited by examiner

*Primary Examiner* — Luan C Thai
(74) *Attorney, Agent, or Firm* — Allen & Overy LLP

(57) ABSTRACT

A semiconductor device of an embodiment includes: a semiconductor substrate; a first insulating layer provided on or above the semiconductor substrate; an aluminum layer provided on the first insulating layer; a second insulating layer provided on the first insulating layer, the second insulating layer covering a first region of a surface of the aluminum layer; and an aluminum oxide film provided on a second region other than the first region of the surface of the aluminum layer, the aluminum oxide film including α-alumina as a main component, and a film thickness of the aluminum oxide film being equal to or larger than 0.5 nm and equal to or smaller than 3 nm.

16 Claims, 16 Drawing Sheets

(52) U.S. Cl.
CPC ............... *H01L 2924/01014* (2013.01); *H01L 2924/01029* (2013.01); *H01L 2924/05432* (2013.01)

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2019-171102, filed on Sep. 20, 2019, the entire contents of which are incorporated herein by reference.

FIELD

Embodiments described herein relate generally to a semiconductor device and a method of manufacturing the semiconductor device.

BACKGROUND

A bonding wire is used to connect an electrode pad on a semiconductor chip and an external electrode such as a lead frame. One end of the bonding wire is connected to the electrode pad, and the other end is connected to the external electrode. In order to improve reliability of the bonding wire, improvement in adhesion between the electrode pad and the bonding wire is demanded.

DETAILED DESCRIPTION

Figure 1:
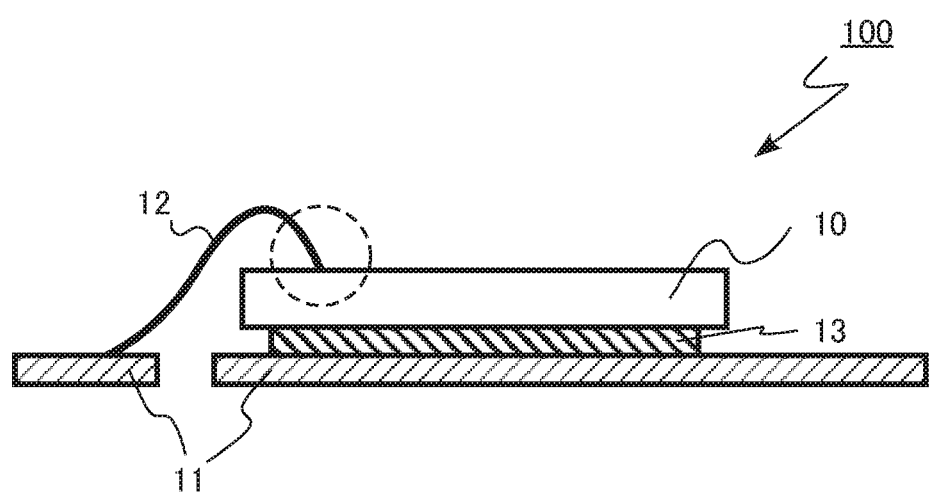
FIG. 1 is a schematic sectional view of a semiconductor device of a first embodiment.

A semiconductor device of an embodiment includes: a semiconductor substrate; a first insulating layer provided on or above the semiconductor substrate; an aluminum layer provided on the first insulating layer; a second insulating layer provided on the first insulating layer, the second insulating layer covering a first region of a surface of the aluminum layer; and an aluminum oxide film provided on a second region other than the first region of the surface of the aluminum layer, the aluminum oxide film including $\alpha$-alumina as a main component, and a film thickness of the aluminum oxide film being equal to or larger than 0.5 nm and equal to or smaller than 3 nm.

In the present description, there is a case where the same sign is assigned with respect to the same or similar members and an overlapped description is omitted.

In the present description, there is a case where an upper direction in the drawing is described as "on" or "above" and a lower direction in the drawing is described as "below" in order to indicate a positional relationship of a part, and the like. In the present description, a concept of "on", "above" and "below" is not necessarily a term indicating a relationship with a direction of gravity.

A qualitative analysis and a quantitative analysis of chemical composition of a member included in a semiconductor device of the present description can be performed, for example, by secondary ion mass spectroscopy (SIMS), or energy dispersive x-ray spectroscopy (EDX). Also, for example, a transmission electron microscope (TEM) can be used for measurement of a thickness of a member included in the semiconductor device, a distance between members, and the like. Also, for identification of a substance, identification of a crystal system, and comparison of an existence rate of a crystal system of a member included in the semiconductor device, x-ray diffraction (XRD), electron beam diffraction (EBD), or x-ray photoelectron spectroscopy (XPS) can be used.

First Embodiment

A semiconductor device of the first embodiment includes: a semiconductor substrate; a first insulating layer provided on the semiconductor substrate; an aluminum layer provided on or above the first insulating layer; a second insulating layer provided on the first insulating layer, the second insulating layer covering a first region of a surface of the aluminum layer; and an aluminum oxide film provided on a second region other than the first region of the surface of the aluminum layer, the aluminum oxide film including $\alpha$-alumina as a main component, and a film thickness of the aluminum oxide film being equal to or larger than 0.5 nm and equal to or smaller than 3 nm.

FIG. 1 is a schematic sectional view of a semiconductor device of the first embodiment. A semiconductor device 100 of the first embodiment includes a semiconductor chip 10, a lead frame 11, a bonding wire 12, and a solder layer 13.

The semiconductor chip 10 is fixed to the lead frame 11 by the solder layer 13. Also, the semiconductor chip 10 is electrically connected to the lead frame 11 by the bonding wire 12.

One end of the bonding wire 12 is connected to an electrode pad (not illustrated) provided on a surface of the semiconductor chip 10. The other end of the bonding wire 12 is connected to the lead frame 11.

The bonding wire 12 is, for example, a copper wire, a gold wire, an aluminum wire, or a copper wire covered with palladium.

Figure 2:
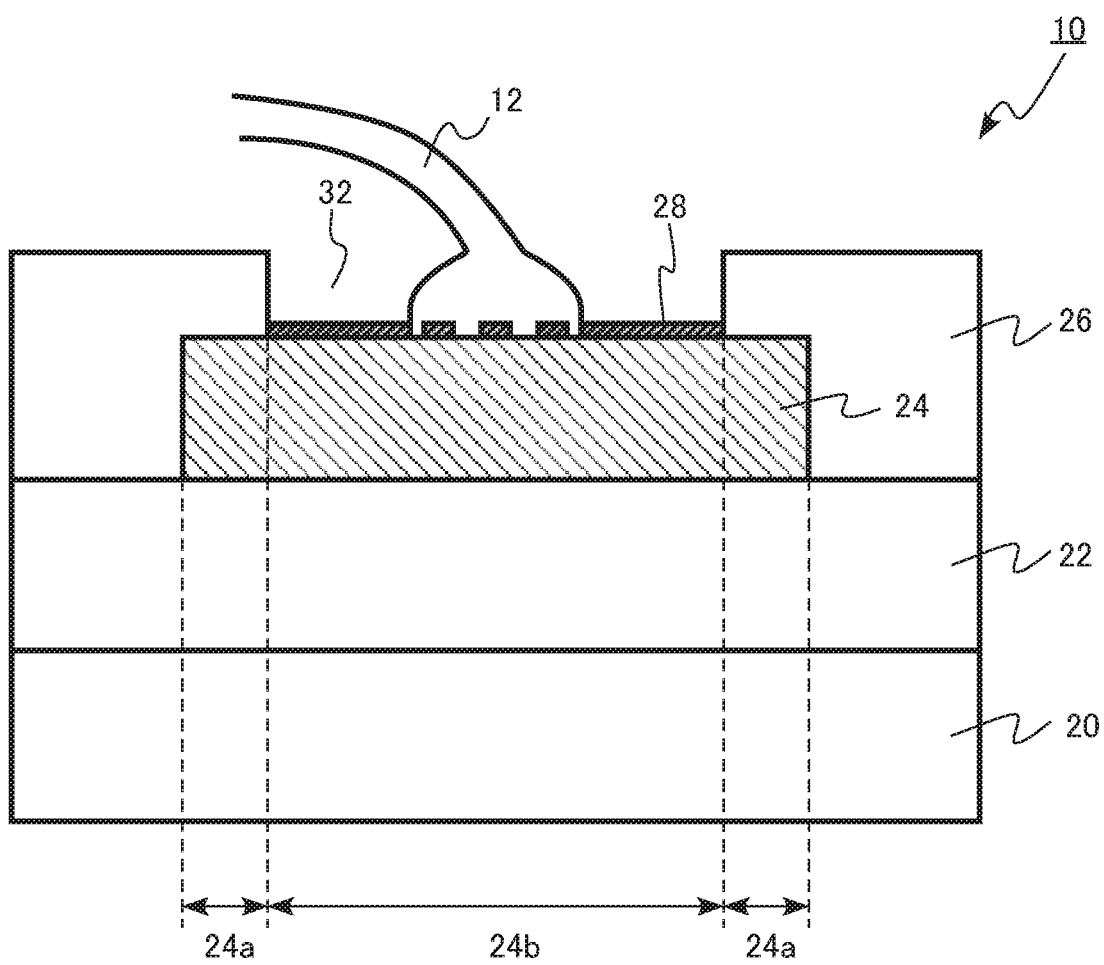
FIG. 2 is an enlarged schematic sectional view of the semiconductor device of the first embodiment.

FIG. 2 is an enlarged schematic sectional view of the semiconductor device of the first embodiment. FIG. 2 is an enlarged view of a part surrounded by a dotted frame in FIG. 1. FIG. 2 is a view including an electrode pad of the semiconductor chip 10, the bonding wire 12 being connected to the electrode pad.

The semiconductor chip 10 includes a silicon substrate 20 (semiconductor substrate), an interlayer insulating layer 22 (first insulating layer), an aluminum layer 24, a protective insulating layer 26 (second insulating layer), and an aluminum oxide film 28.

The silicon substrate 20 is a silicon substrate of a single crystal. The silicon substrate 20 is an example of a semiconductor substrate. For example, a semiconductor element such as a transistor or a diode (not illustrated) is formed in the silicon substrate 20.

The interlayer insulating layer 22 is provided on or above the silicon substrate 20. The interlayer insulating layer 22, for example, includes a silicon oxide. Other layer may be interposed between the silicon substrate 20 and the interlayer insulating layer 22.

The aluminum layer 24 is provided on the interlayer insulating layer 22. The aluminum layer 24 is an electrode pad of the semiconductor chip 10.

The aluminum layer 24 is, for example, an aluminum alloy. The aluminum layer 24 is, for example, an aluminum alloy including at least one of silicon and copper.

The protective insulating layer 26 is provided on the interlayer insulating layer 22. The protective insulating layer 26 covers a first region 24a of a surface of the aluminum layer 24. The protective insulating layer 26 has an opening 32 above the aluminum layer 24.

The protective insulating layer 26 has, for example, a stacked structure of a silicon oxide and a silicon nitride.

The aluminum oxide film 28 is provided on the aluminum layer 24. The aluminum oxide film 28 is provided on a second region 24b other than the first region 24a of the surface of the aluminum layer 24.

The aluminum oxide film 28 includes alpha alumina ($\alpha$-$Al_2O_3$: $\alpha$-alumina) as a main component. Including $\alpha$-alumina as a main component means that $\alpha$-alumina is a substance with the highest mole fraction among substances included in the aluminum oxide film 28.

The $\alpha$-alumina is an aluminum oxide of a trigonal crystal system. There is also a classification method of classifying the trigonal crystal system into a hexagonal crystal system.

A film thickness of the aluminum oxide film 28 is equal to or larger than 0.5 nm and equal to or smaller than 3 nm.

The bonding wire 12 is connected onto the second region 24b of the aluminum layer 24. For example, there is the aluminum oxide film 28 in a part between the bonding wire 12 and the aluminum layer 24.

Next, an example of a method of manufacturing the semiconductor device of the first embodiment will be described.

The method of manufacturing the semiconductor device of the first embodiment includes: forming a first insulating layer on a semiconductor substrate; forming an aluminum layer on the first insulating layer; performing patterning of the aluminum layer; forming a second insulating layer on the first insulating layer and the aluminum layer; forming a mask material on the second insulating layer; performing etching of the second insulating layer with a mask material as a mask by a reactive ion etching method using gas including fluorine, and exposing a part of a surface of the aluminum layer; and performing a cleaning process to inject liquid with pH 6 or higher to pH 7.5 or lower to the part of the surface.

FIG. 3, FIG. 4, FIG. 5, FIG. 6, FIG. 7, FIG. 8, FIG. 9, and FIG. 10 are schematic sectional views of a method of manufacturing the semiconductor device of the first embodiment.

First, an interlayer insulating layer 22 is formed on a silicon substrate 20. The interlayer insulating layer 22 is formed, for example, by utilization of a chemical vapor deposition method (CVD method).

Figure 3:
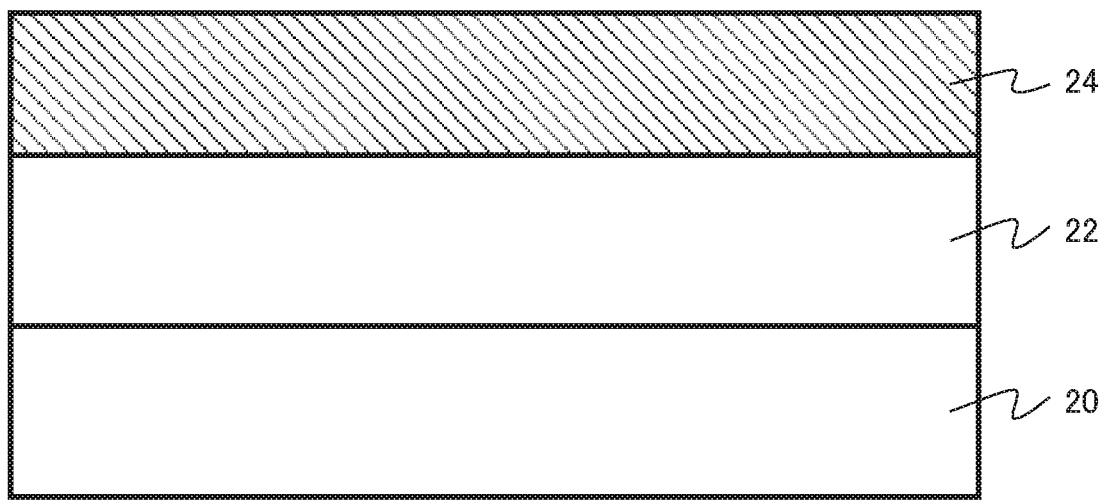
FIG. 3 is a schematic sectional view of a method of manufacturing the semiconductor device of the first embodiment.

Next, an aluminum layer 24 is formed on the interlayer insulating layer 22. The aluminum layer 24 is formed, for example, by utilization of a sputtering method (FIG. 3).

Figure 4:
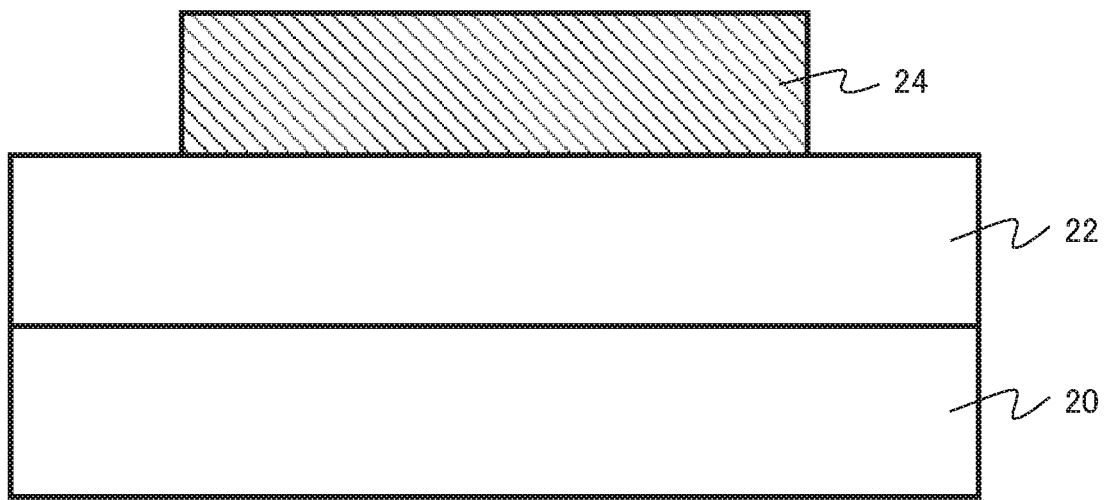
FIG. 4 is a schematic sectional view of the method of manufacturing the semiconductor device of the first embodiment.

Next, patterning of the aluminum layer 24 is performed (FIG. 4). Patterning of the aluminum layer 24 is performed, for example, by utilization of a photolithography method and a reactive ion etching method (RIE method).

Figure 5:
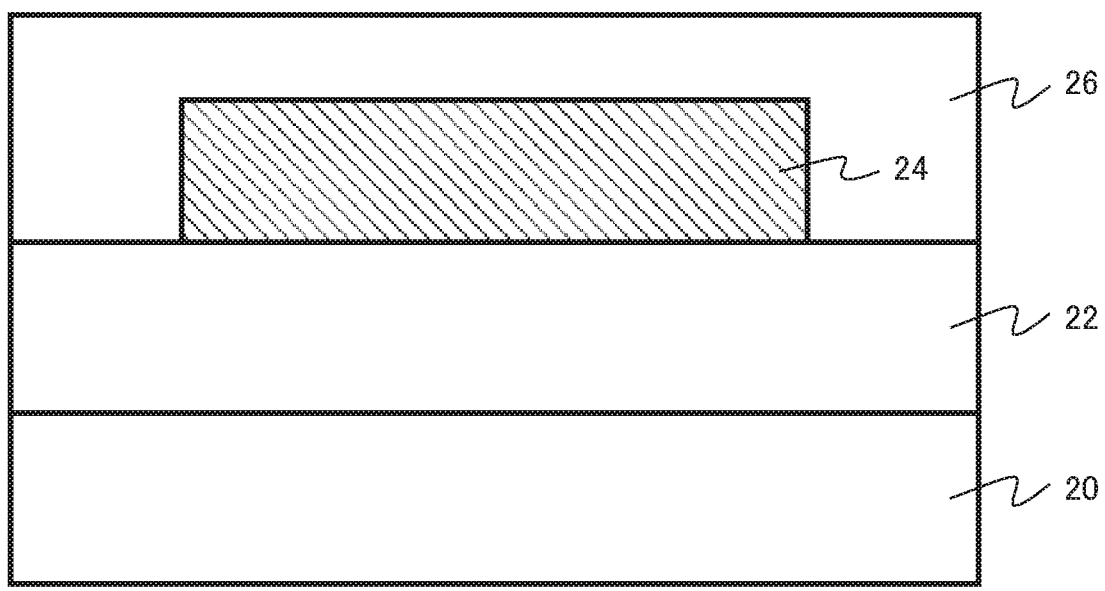
FIG. 5 is a schematic sectional view of the method of manufacturing the semiconductor device of the first embodiment.

Next, a protective insulating layer 26 is formed on the interlayer insulating layer 22 and the aluminum layer 24 (FIG. 5). The protective insulating layer 26 is formed, for example, by utilization of the CVD method.

Figure 6:
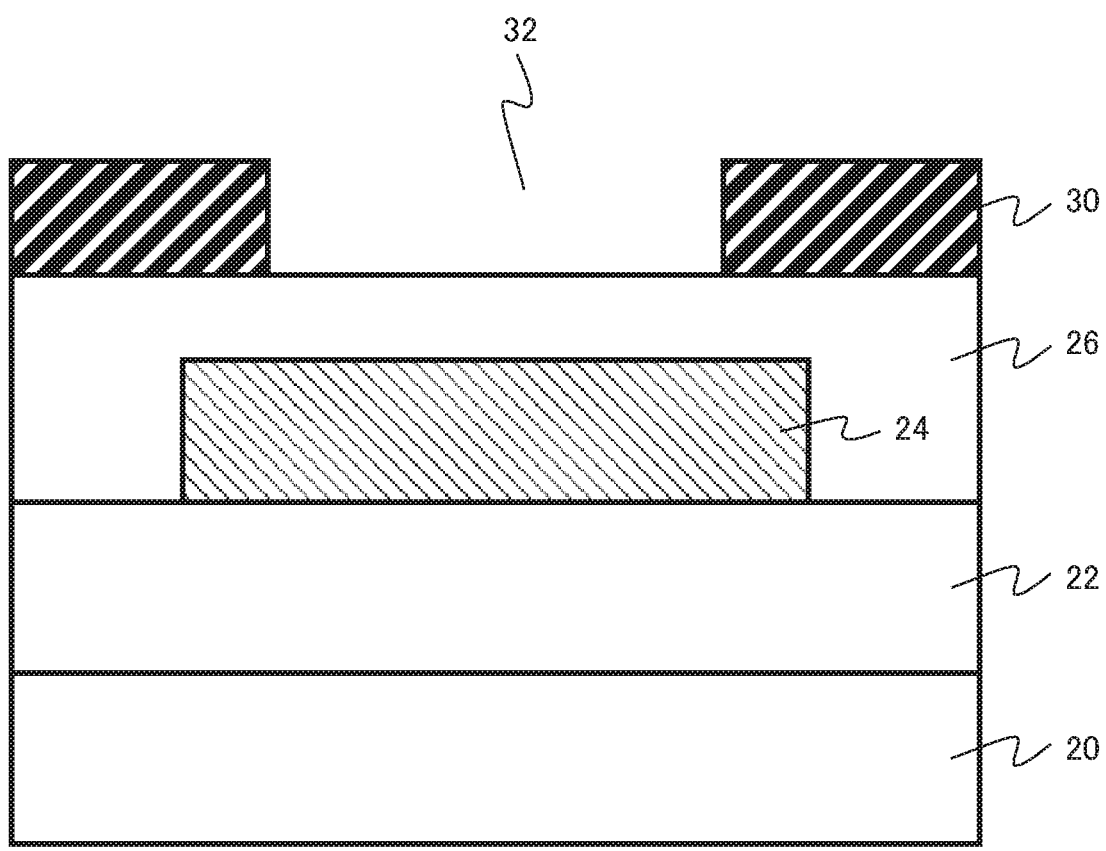
FIG. 6 is a schematic sectional view of the method of manufacturing the semiconductor device of the first embodiment.

Next, a photoresist 30 (mask material) is formed on the protective insulating layer 26 (FIG. 6). The photoresist 30 includes an opening 32 in a region above the aluminum layer 24.

Figure 7:
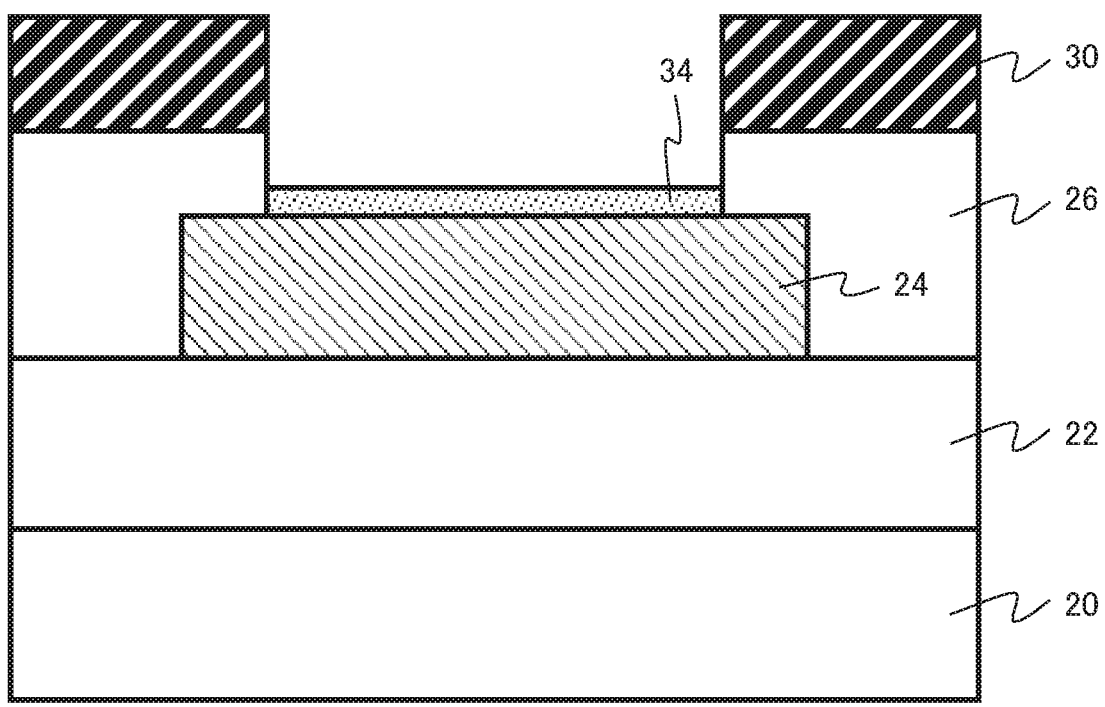
FIG. 7 is a schematic sectional view of the method of manufacturing the semiconductor device of the first embodiment.

Next, the protective insulating layer 26 is etched with the photoresist 30 as a mask (FIG. 7). By the etching, a part of the surface of the aluminum layer 24 is exposed.

The etching of the protective insulating layer 26 is performed by the RIE method using an etching gas including fluorine. For example, the etching gas includes carbon tetrafluoride ($CF_4$) or trifluoromethane ($CHF_3$).

For example, the etching gas includes a nitrogen gas.

The etching gas of the protective insulating layer 26 is, for example, a mixed gas of carbon tetrafluoride ($CF_4$), a nitrogen gas, and an oxygen gas.

After the etching of the protective insulating layer 26, a fluorine-containing film 34 is formed on the exposed part of the surface of the aluminum layer 24. The fluorine-containing film 34 is a film including fluorine derived from the etching gas.

The fluorine-containing film 34 is, for example, a silicon oxide film including fluorine. The fluorine-containing film 34 is, for example, a film including gamma alumina ($\gamma$-$Al_2O_3$: $\gamma$-alumina) as a main component. Including $\gamma$-alumina as a main component means that $\gamma$-alumina is a substance of the highest mole fraction among substances included in the fluorine-containing film 34.

The $\gamma$-alumina is an aluminum oxide of a cubic crystal system.

A film thickness of the fluorine-containing film 34 is, for example, equal to or larger than 5 nm.

Figure 8:
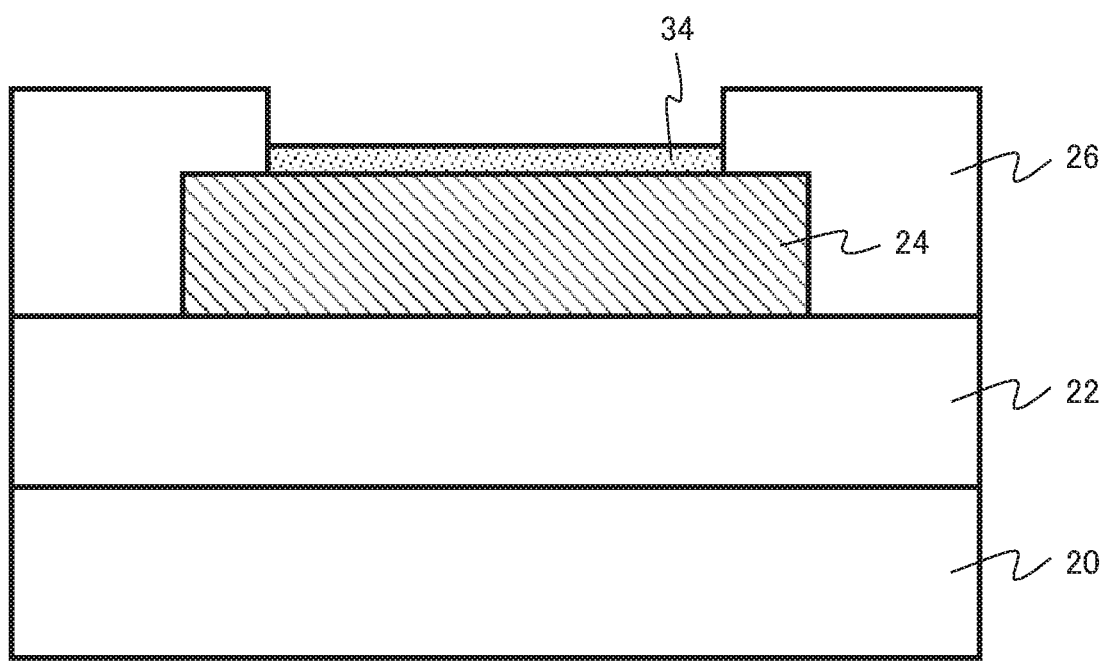
FIG. 8 is a schematic sectional view of the method of manufacturing the semiconductor device of the first embodiment.

Next, a removal of the photoresist 30 is performed (FIG. 8). The removal of the photoresist 30 is performed by ashing using oxygen plasma. A temperature of the ashing is, for example, equal to or lower than 50° C.

Figure 9:
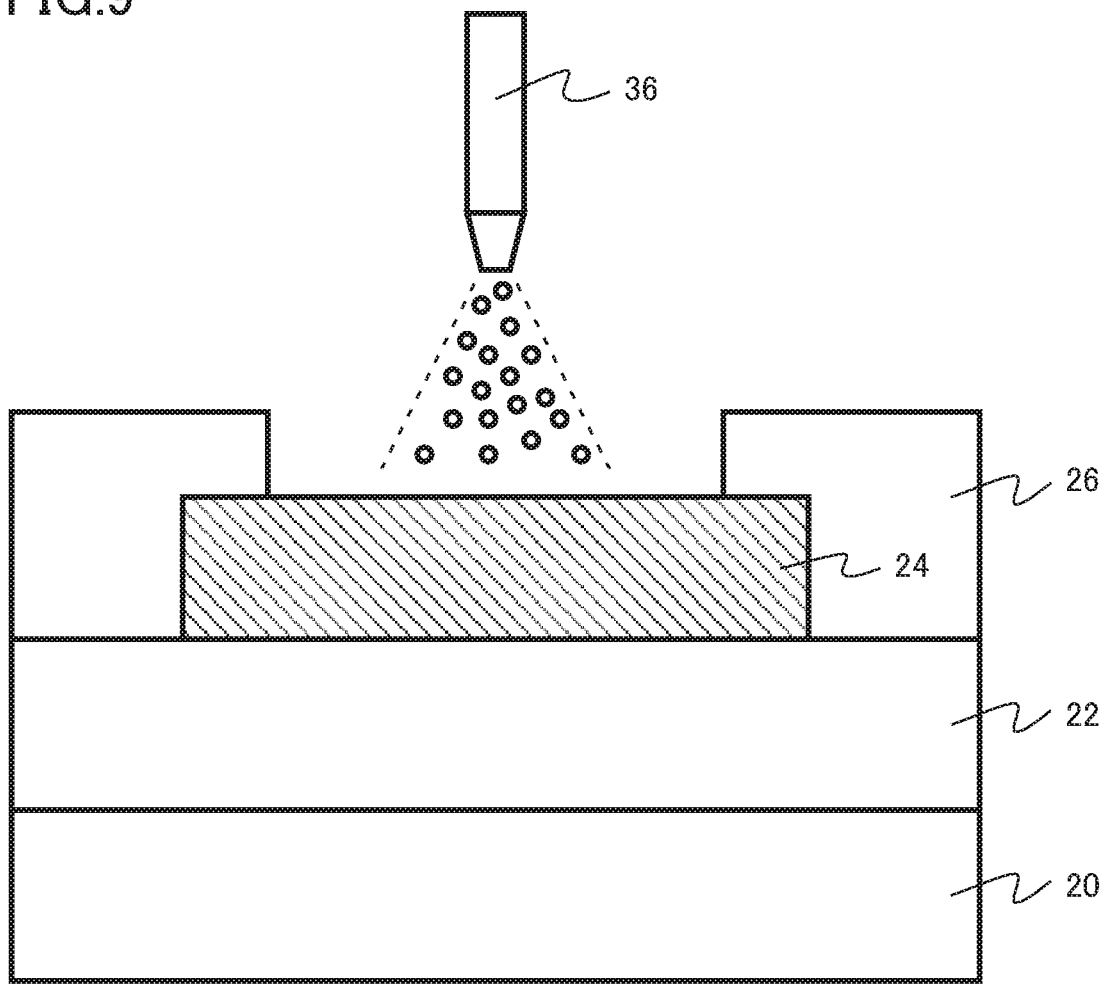
FIG. 9 is a schematic sectional view of the method of manufacturing the semiconductor device of the first embodiment.

Next, a cleaning process is performed on the surface of the aluminum layer 24, the surface being exposed by the etching of the protective insulating layer 26 (FIG. 9). The cleaning process is performed by injection of liquid with pH 6 or higher to pH 7.5 or lower to the surface of the aluminum layer 24 from a nozzle 36.

The liquid is, for example, water. The liquid is, for example, pure water.

The liquid, for example, shows a slightly acidic property or a slightly alkaline property, that is, pH 6 or higher to pH 6.9 or lower, or pH 7.1 or higher to pH 7.5 or lower. The liquid is, for example, a dilute solution of acid or a dilute solution of alkali. The liquid is, for example, an aqueous solution of carbonic acid ($H_2CO_3$), an aqueous solution of hydrochloric acid (HCl), or an aqueous solution of potassium chloride (KCl).

All or most of the fluorine-containing film 34 is physically removed by the cleaning process. A film thickness of the fluorine-containing film 34 after the cleaning process is, for example, equal to or smaller than 2 nm.

Figure 10:
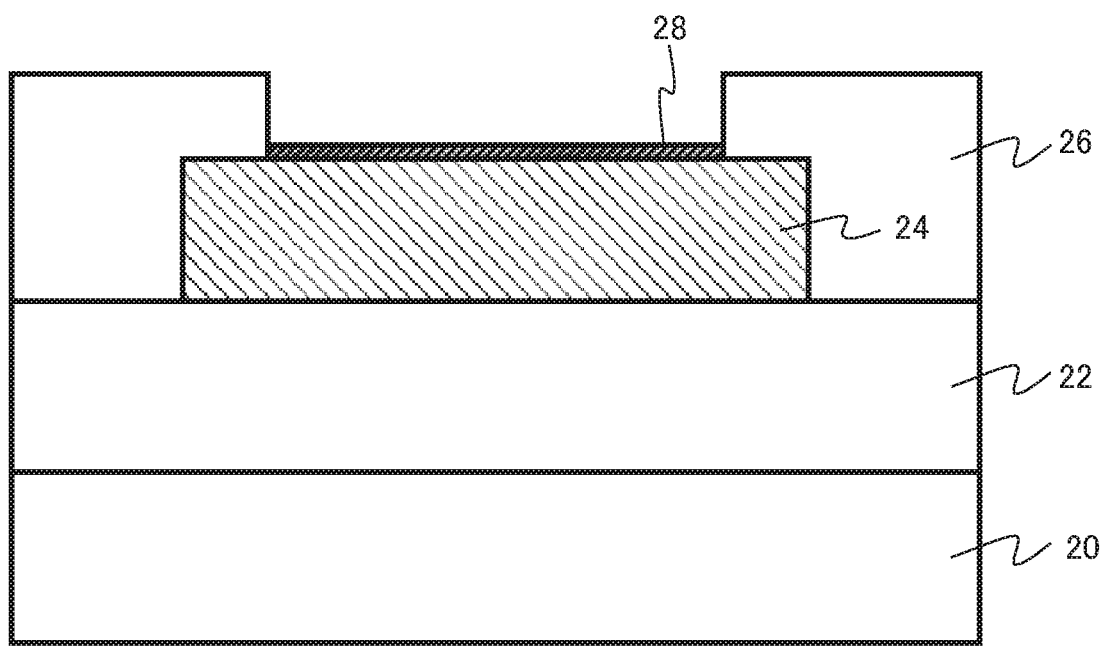
FIG. 10 is a schematic sectional view of the method of manufacturing the semiconductor device of the first embodiment.

Next, heat treatment at 250° C. or higher to 450° C. or lower is performed in a non-oxidizing atmosphere (FIG. 10). For example, the heat treatment is performed in a nitrogen atmosphere.

By the heat treatment, an aluminum oxide film 28 is formed on a region in the surface of the aluminum layer 24, the region being not covered with the protective insulating layer 26. The aluminum oxide film 28 includes alpha alumina ($\alpha$-$Al_2O_3$: $\alpha$-alumina) as a main component. A film thickness of the aluminum oxide film 28 is equal to or smaller than 3 nm.

Subsequently, a bonding wire is connected to a part of the surface of the aluminum layer 24, and the semiconductor device 100 illustrated in FIG. 1 and FIG. 2 is produced.

When the bonding wire 12 is connected to the aluminum layer 24, the aluminum oxide film 28 is crashed. As a result, the bonding wire 12 and the aluminum layer 24 are electrically connected, and the aluminum oxide film 28 remains in a part between the bonding wire 12 and the aluminum layer 24.

Next, a function and an effect of the semiconductor device of the first embodiment and a method of manufacturing the semiconductor device will be described.

Figure 11:
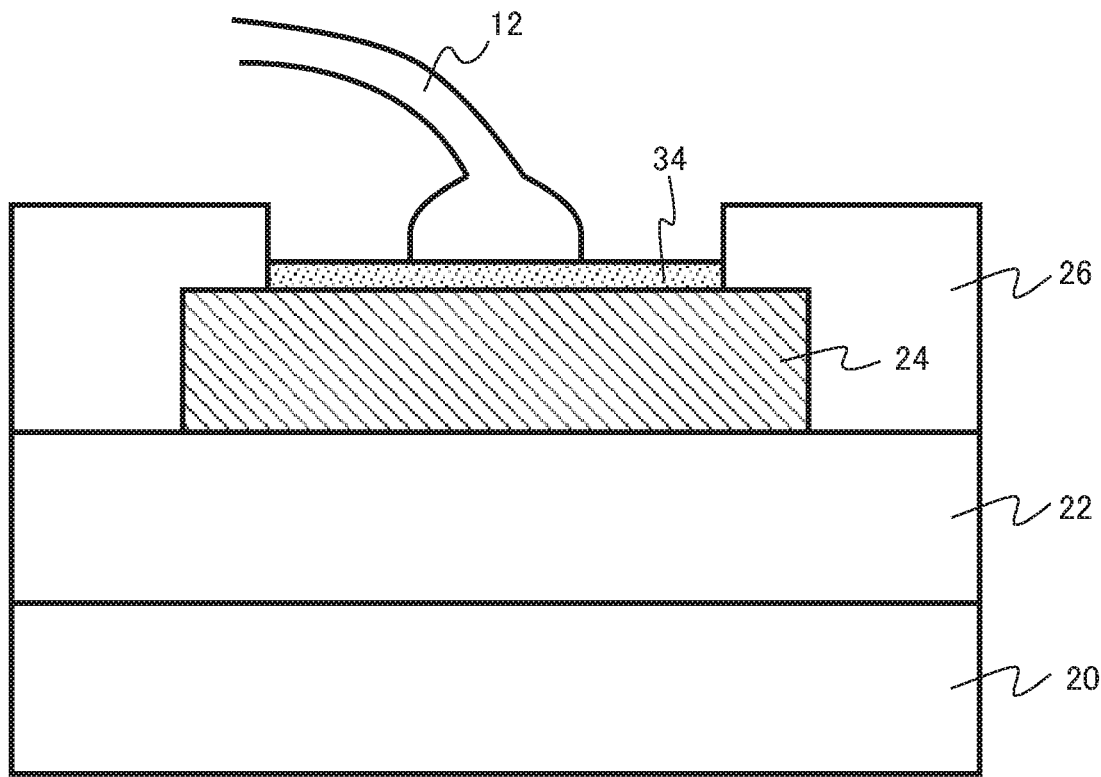
FIG. 11 is an enlarged schematic sectional view of a semiconductor device of a comparison example.

FIG. 11 is an enlarged schematic sectional view of a semiconductor device of a comparison example. The semiconductor device of the comparison example is different from the semiconductor device of the first embodiment in a point that the comparison example is manufactured while a cleaning process in the method of manufacturing the semiconductor device of the first embodiment is omitted.

Since the cleaning process is omitted, a thick fluorine-containing film 34 remains on a surface of an aluminum layer 24 in the semiconductor device of the comparison example. Since the thick fluorine-containing film 34 is sandwiched between a bonding wire 12 and an aluminum layer 24, adhesion between the bonding wire 12 and the aluminum layer 24 is decreased. Thus, for example, there is a problem that the bonding wire 12 may easily be separated from the aluminum layer 24 and reliability of the semiconductor device is deteriorated.

Also, there is a problem that the fluorine-containing film 34 and a surface of the aluminum layer 24 react with each other, corrosion of the surface of the aluminum layer 24 is advanced, and reliability of the semiconductor device is deteriorated.

In the method of manufacturing the semiconductor device of the first embodiment, a cleaning process to inject liquid with pH 6 or higher to pH 7.5 or lower from a nozzle 36 to a surface of an aluminum layer 24 is performed, the surface being exposed by etching of a protective insulating layer 26. By this cleaning process, all or most of a thick fluorine-containing film 34 on the surface of the aluminum layer 24 is removed.

Subsequently, an aluminum oxide film 28 is formed on the surface of the aluminum layer 24. A film thickness of the aluminum oxide film 28 is thin and is equal to or smaller than 3 nm. Thus, when a bonding wire 12 is connected to the aluminum layer 24, the aluminum oxide film 28 is crashed. Thus, the bonding wire 12 and the aluminum layer 24 are directly connected, and adhesion between the bonding wire 12 and the aluminum layer 24 is improved.

In the cleaning process, liquid close to neutral, that is, with pH 6 or higher to pH 7.5 or lower is used. For example, when a strong alkali solution is used for removal of the fluorine-containing film 34, a thick aluminum oxide film 28 is formed after the removal of the fluorine-containing film 34, and there is a possibility that adhesion between the bonding wire 12 and the aluminum layer 24 is decreased. Also, when a strong acid solution is used for the removal of the fluorine-containing film 34, there is a possibility that the surface of the aluminum layer 24 is etched.

In the cleaning process of the first embodiment, the liquid close to neutral, that is, with pH 6 or higher to pH 7.5 or lower is used. Thus, formation of thick aluminum oxide film on the aluminum layer 24 is suppressed. Also, etching of the surface of the aluminum layer 24 is suppressed.

The liquid used for the cleaning process preferably has pH 6 or higher to pH 6.9 or lower, or pH 7.1 or higher to pH 7.5 or lower. The liquid used for the cleaning process is preferably a dilute solution of acid or a dilute solution of alkali.

Since there is an ion in the liquid slightly, charging of a semiconductor substrate during the cleaning process is suppressed. Thus, for example, an electrostatic breakdown of an insulating layer is suppressed.

An etching gas in etching of the protective insulating layer 26 preferably includes a nitrogen gas. When the nitrogen gas is included, an etching rate becomes high. Thus, etching time of the protective insulating layer 26 becomes shorter, and an amount of fluorine remaining on the surface of the aluminum layer 24 may be decreased. Thus, a film thickness of the fluorine-containing film 34 becomes small and removal of the fluorine-containing film 34 by the cleaning process becomes easier.

A temperature of ashing in a removal of a photoresist 30 is preferably equal to or lower than 50° C. When a temperature of ashing is high, fluorine in the fluorine-containing film 34 is diffused to the aluminum layer 24. Thus, there is a possibility that a film quality of the aluminum oxide film 28 is deteriorated.

The surface of the aluminum layer 24 of the semiconductor device 100 is covered with the aluminum oxide film 28 having a thickness equal to or larger than 0.5 nm. The aluminum oxide film 28 includes $\alpha$-alumina as a main component. The $\alpha$-alumina is more stable than $\gamma$-alumina, for example. Thus, corrosion of the surface of the aluminum layer 24 is prevented. Thus, reliability of the semiconductor device 100 is improved. Since the thickness is equal to or larger than 0.5 nm, a sufficient reliability improvement effect is acquired.

As described above, according to the first embodiment, a semiconductor device and a production method thereof with which adhesion between an electrode pad and a bonding wire is improved can be realized.

Second Embodiment

A semiconductor device of the second embodiment is different from the semiconductor device of the first embodiment in a point of further including a polyimide layer on a second insulating layer. In the following, a part of a description of contents overlapped with the first embodiment may be omitted.

Figure 12:
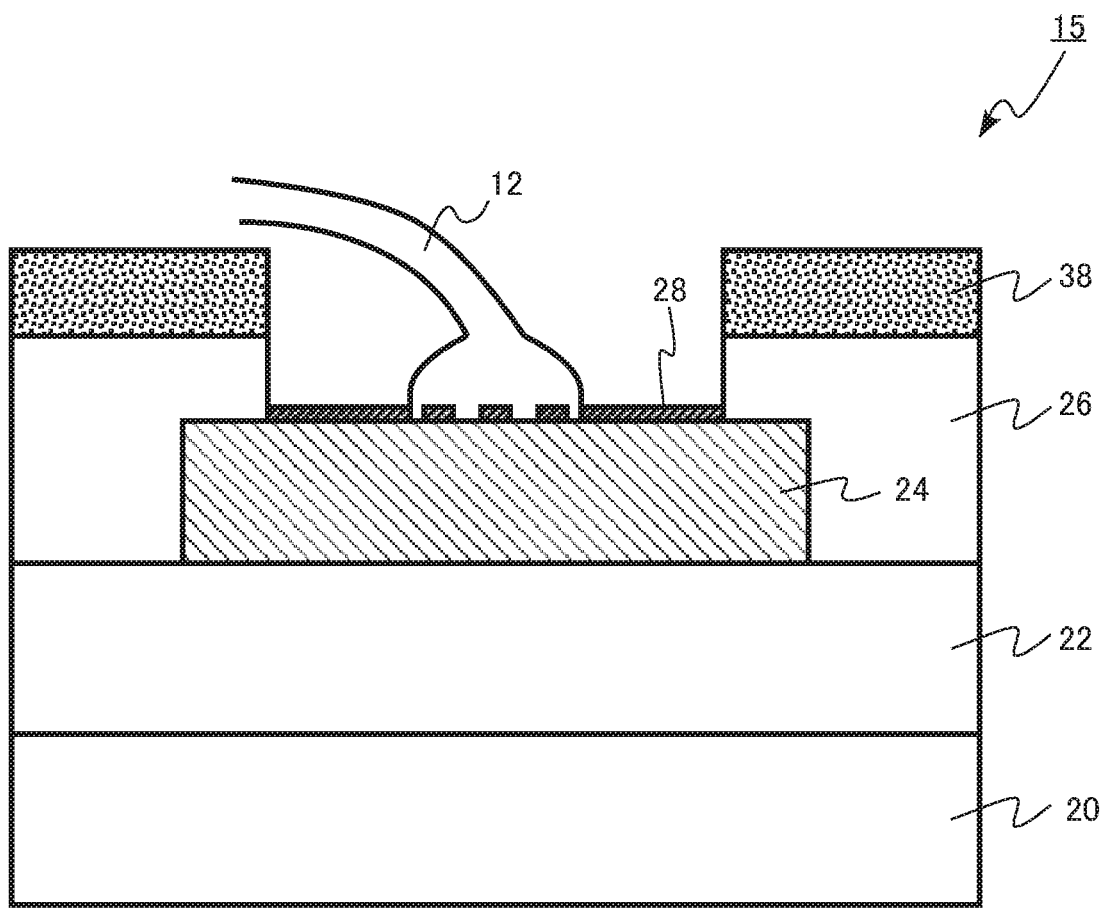
FIG. 12 is an enlarged schematic sectional view of a semiconductor device of a second embodiment.

FIG. 12 is an enlarged schematic sectional view of the semiconductor device of the second embodiment. FIG. 12 is a view corresponding to FIG. 2 of the first embodiment. The semiconductor device of the second embodiment includes a semiconductor chip 15.

The semiconductor chip 15 includes a silicon substrate 20 (semiconductor substrate), an interlayer insulating layer 22 (first insulating layer), an aluminum layer 24, a protective insulating layer 26 (second insulating layer), an aluminum oxide film 28, and a polyimide layer 38.

The polyimide layer 38 is provided on the protective insulating layer 26.

Next, an example of a method of manufacturing the semiconductor device of the second embodiment will be described.

The method of manufacturing the semiconductor device of the second embodiment is different from the method of manufacturing the semiconductor device of the first embodiment in a point that a mask material is a photosensitive polyimide. In the following, a part of a description of contents overlapped with the first embodiment may be omitted.

FIG. 13, FIG. 14, FIG. 15, and FIG. 16 are schematic sectional views of the method of manufacturing the semiconductor device of the second embodiment.

A production method up to forming of a protective insulating layer 26 on an interlayer insulating layer 22 and an aluminum layer 24 is similar to the method of manufacturing the first semiconductor device.

Figure 13:
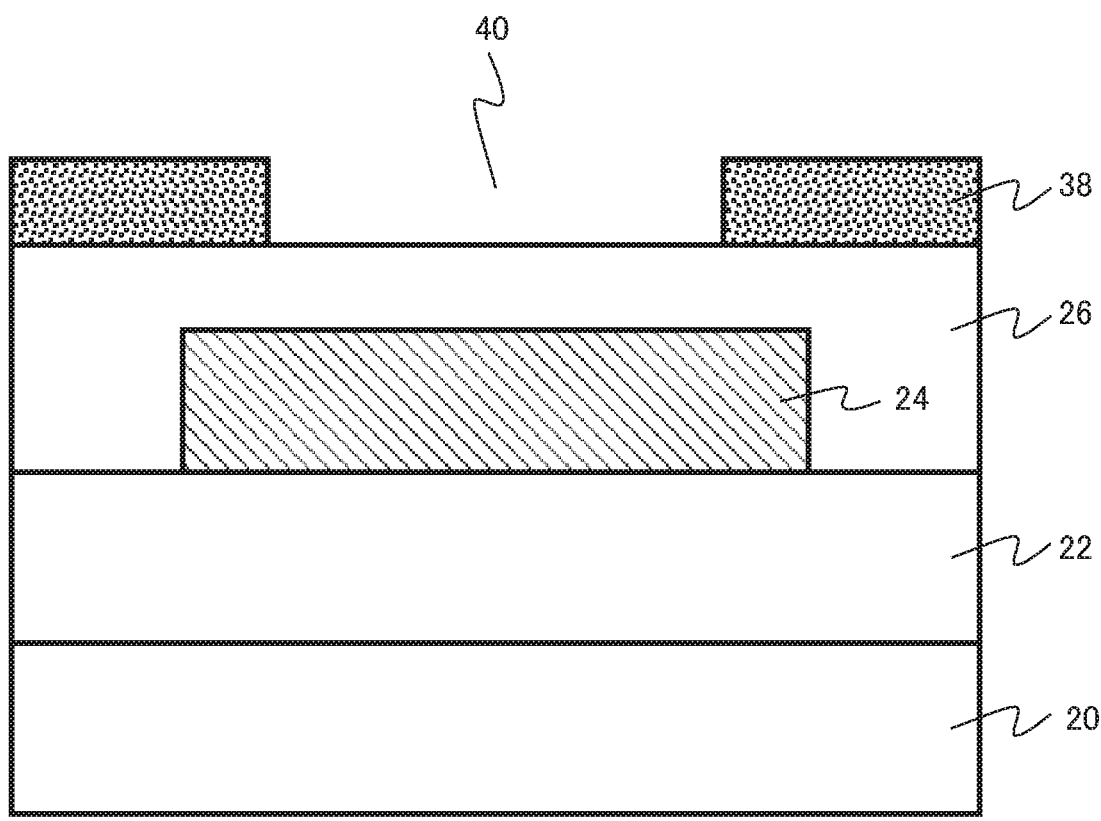
FIG. 13 is a schematic sectional view of a method of manufacturing the semiconductor device of the second embodiment.

Next, a polyimide layer 38 (mask material) is formed on the protective insulating layer 26 (FIG. 13). The polyimide layer 38 is a photosensitive polyimide. The polyimide layer 38 includes an opening 40 in a region above the aluminum layer 24.

Figure 14:
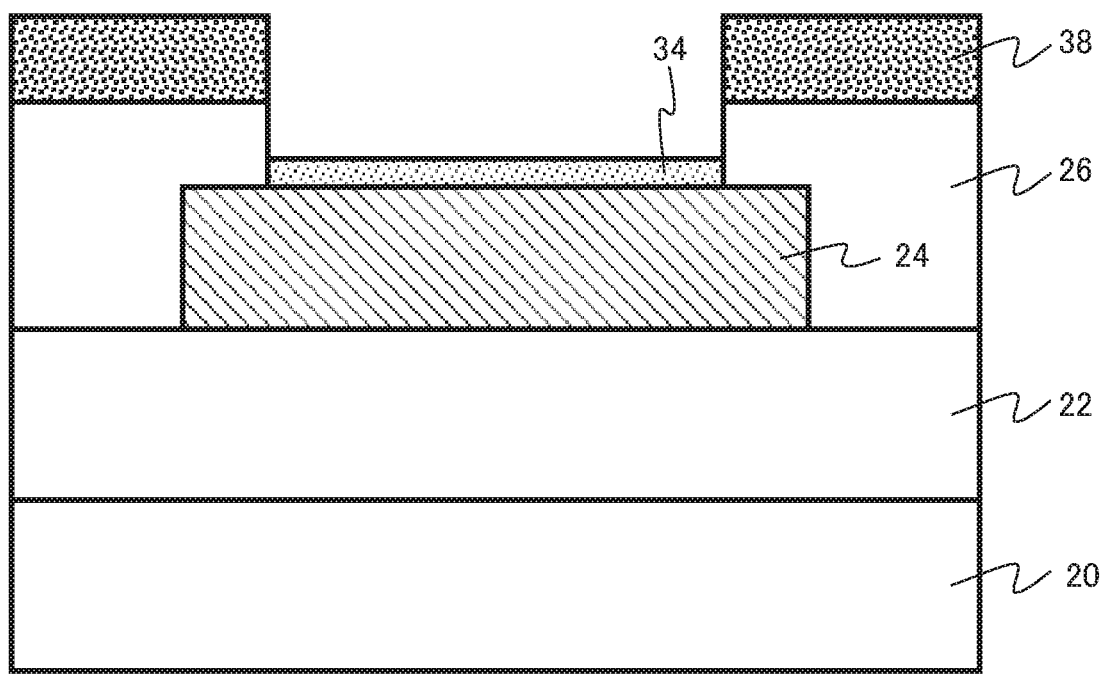
FIG. 14 is a schematic sectional view of the method of manufacturing the semiconductor device of the second embodiment.

Next, the protective insulating layer 26 is etched with the polyimide layer 38 as a mask (FIG. 14). By the etching, a part of the surface of the aluminum layer 24 is exposed.

The etching of the protective insulating layer 26 is performed by an RIE method using an etching gas including fluorine. For example, the etching gas includes carbon tetrafluoride ($CF_4$) or trifluoromethane ($CHF_3$).

After the etching of the protective insulating layer 26, a fluorine-containing film 34 is formed on the exposed part of the surface of the aluminum layer 24. The fluorine-containing film 34 is a film including fluorine derived from the etching gas.

Figure 15:
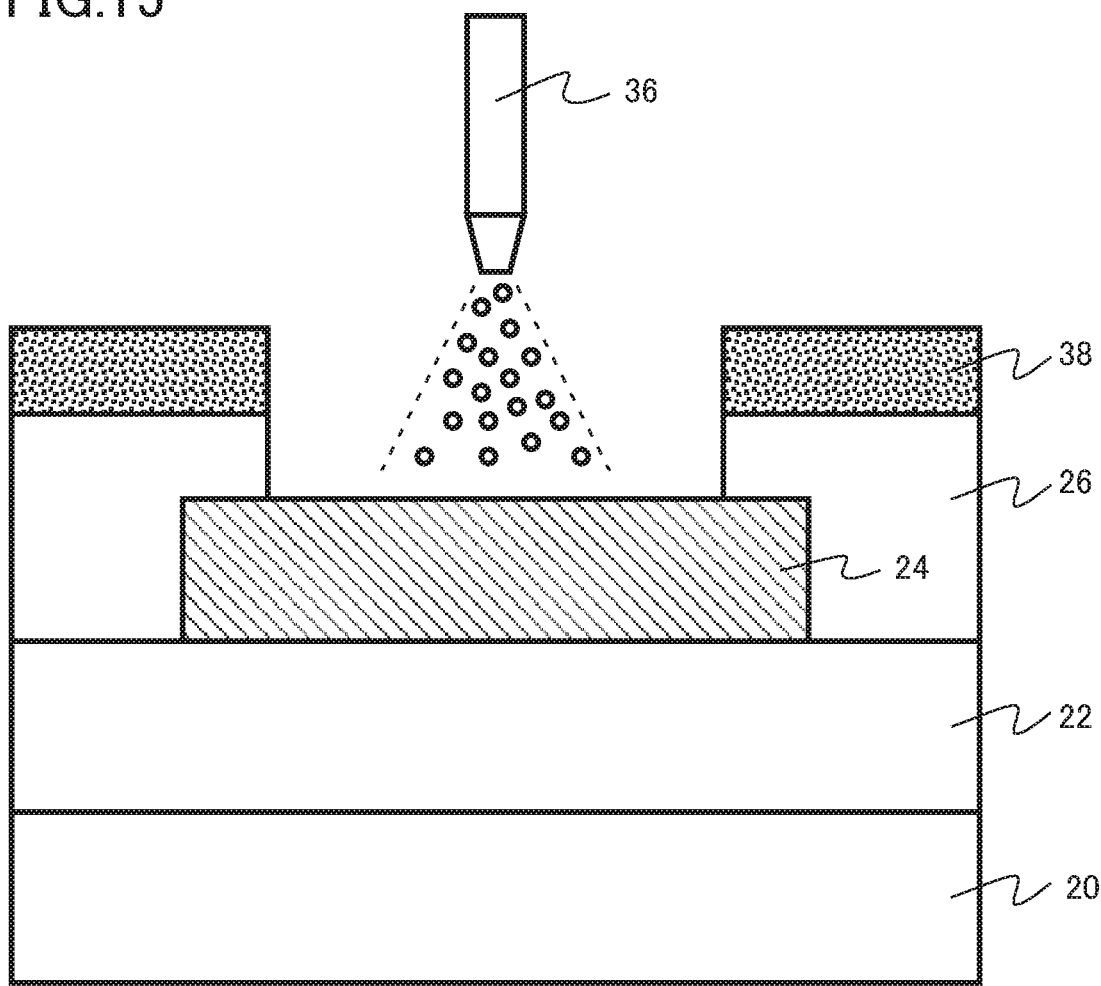
FIG. 15 is a schematic sectional view of the method of manufacturing the semiconductor device of the second embodiment.

Next, a cleaning process is performed on the part of the surface of the aluminum layer 24, the part being exposed by the etching of the protective insulating layer 26 (FIG. 15). The cleaning process is performed by injection of the liquid with pH 6 or higher to pH 7.5 or lower from a nozzle 36.

All or most of the fluorine-containing film 34 is physically removed by the cleaning process. A film thickness of the fluorine-containing film 34 after the cleaning process is, for example, equal to or smaller than 2 nm.

Figure 16:
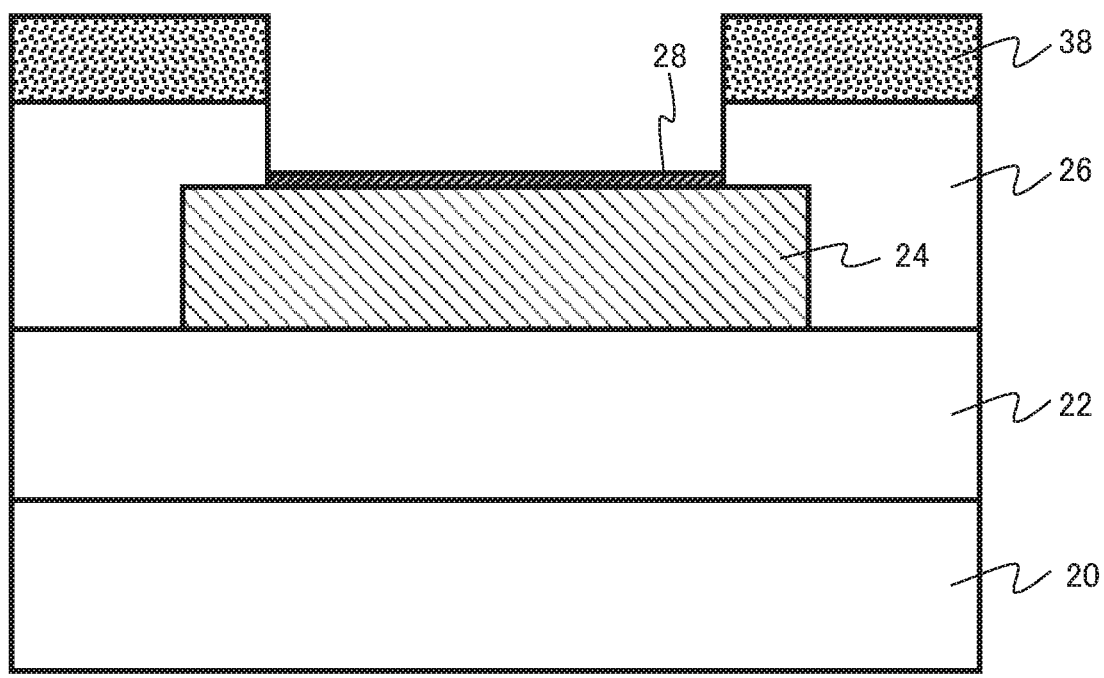
FIG. 16 is a schematic sectional view of the method of manufacturing the semiconductor device of the second embodiment.

Next, heat treatment at 250° C. or higher to 450° C. or lower is performed in a non-oxidizing atmosphere (FIG. 16). By the heat treatment, an aluminum oxide film 28 is formed on a region in the surface of the aluminum layer 24, the region being not covered with the protective insulating layer 26. The aluminum oxide film 28 includes alpha alumina ($\alpha$-$Al_2O_3$: $\alpha$-alumina) as a main component. A film thickness of the aluminum oxide film 28 is equal to or smaller than 3 nm.

Subsequently, a bonding wire is connected to a part of the surface of the aluminum layer 24, and the semiconductor device illustrated in FIG. 12 is produced.

As described above, according to the second embodiment, a semiconductor device and a method of manufacturing thereof with which adhesion between an electrode pad and a bonding wire is improved can be realized similarly to the first embodiment.

While certain embodiments have been described, these embodiments have been presented by way of example only, and are not intended to limit the scope of the inventions. Indeed, a semiconductor device and a method of manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a first insulating layer provided on or above the semiconductor substrate;
   an aluminum layer provided on the first insulating layer;
   a second insulating layer provided on the first insulating layer, the second insulating layer covering a first region of a surface of the aluminum layer; and
   an aluminum oxide film provided on a second region other than the first region of the surface of the aluminum layer, the aluminum oxide film including $\alpha$-alumina as a main component, and a film thickness of the aluminum oxide film being equal to or larger than 0.5 nm and equal to or smaller than 3 nm.

2. The semiconductor device according to claim 1, wherein the aluminum layer includes at least one of silicon and copper.

3. The semiconductor device according to claim 1, further comprising a polyimide layer provided on the second insulating layer.

4. The semiconductor device according to claim 1, further comprising a bonding wire provided on the second region.

5. The semiconductor device according to claim 4, wherein the aluminum oxide film exists in a part between the bonding wire and the aluminum layer.

6. A method of manufacturing a semiconductor device, comprising:
   forming a first insulating layer on or above a semiconductor substrate;
   forming an aluminum layer on the first insulating layer;
   performing patterning of the aluminum layer;
   forming a second insulating layer on the first insulating layer and the aluminum layer;
   forming a mask material on the second insulating layer;
   performing etching of the second insulating layer with the mask material as a mask by a reactive ion etching method using an etching gas including fluorine, and exposing a part of a surface of the aluminum layer; and performing a cleaning process to inject liquid with pH 6 or high to pH 7.5 or lower to the part of the surface.

7. The method of manufacturing a semiconductor device according to claim 6, wherein the liquid is an aqueous solution with pH 6 or high to pH 6.9 or lower, or pH 7.1 or higher to pH 7.5 or lower.

8. The method of manufacturing a semiconductor device according to claim 6, wherein the liquid is a dilute solution of acid or a dilute solution of alkali.

9. The method of manufacturing a semiconductor device according to claim 6, wherein the liquid includes carbonic acid.

10. The method of manufacturing a semiconductor device according to claim 6, wherein the liquid is injected along with a nitrogen gas.

11. The method of manufacturing a semiconductor device according to claim 6, wherein the etching gas includes a nitrogen gas.

12. The method of manufacturing a semiconductor device according to claim 6, further comprising: performing heat treatment at 450° C. or lower is performed in a non-oxidizing atmosphere after the cleaning process.

13. The method of manufacturing a semiconductor device according to claim 6, wherein the mask material is a photoresist, and the photoresist is removed by ashing at a temperature of 50° C. or lower after the performing etching of the second insulating layer and before the performing cleaning process.

14. The method of manufacturing a semiconductor device according to claim 6, wherein the mask material is a photosensitive polyimide.

15. The method of manufacturing a semiconductor device according to claim 6, wherein the aluminum layer includes at least one of silicon and copper.

16. The method of manufacturing a semiconductor device according to claim 6, further comprising: connecting a bonding wire to the part of the surface after the performing cleaning process.

\* \* \* \* \*